United States Patent [19]

Hayashi et al.

[11] Patent Number: 5,140,391
[45] Date of Patent: Aug. 18, 1992

[54] THIN FILM MOS TRANSISTOR HAVING PAIR OF GATE ELECTRODES OPPOSING ACROSS SEMICONDUCTOR LAYER

[75] Inventors: Hisao Hayashi; Michio Negishi; Takashi Noguchi; Takefumi Ohshima; Yuji Hayashi; Toshikazu Maekawa; Takeshi Matsushita, all of Kanagawa, Japan

[73] Assignee: Sony Corporation, Tokyo, Japan

[21] Appl. No.: 601,003

[22] Filed: Oct. 19, 1990

Related U.S. Application Data

[63] Continuation of Ser. No. 232,133, Aug. 15, 1988, abandoned.

[30] Foreign Application Priority Data

Aug. 24, 1987 [JP] Japan .................... 62-209816

[51] Int. Cl.$^5$ .................... H01L 27/12; H01L 27/01; H01L 27/13; H01L 45/00
[52] U.S. Cl. .................... 357/23.7; 357/4; 357/23.24
[58] Field of Search .................... 357/23.7, 4, 23.1

[56] References Cited

U.S. PATENT DOCUMENTS

| 3,385,731 | 5/1968 | Weimer et al. | 357/23.7 |
| 3,500,137 | 5/1970 | Schroen et al. | 357/23.7 |
| 4,422,090 | 12/1983 | Shepherd et al. | 357/4 |

FOREIGN PATENT DOCUMENTS

| 0090661 | 5/1983 | European Pat. Off. | 357/23.7 |
| 57-90977 | 12/1982 | Japan | 357/23.7 |
| 60-81869 | 5/1985 | Japan | 357/4 |
| 60-083370 | 5/1985 | Japan | 357/23.7 |
| 2064866 | of 1981 | United Kingdom . | |

OTHER PUBLICATIONS

Charles L. Cohen "New FET Design Could Speed the Arrival of 34–D Circuits"*Electronics* (Sep. 1985) p. 14.
C. Cohen, "3–d IC may auger denses VLSI circuitry; multiple layers are a possibility", *Electronics*, vol. 56, No. 29 Sep. 22 1983). p. 92.
"An Experimental Study of the Indium Antimonide Thin Film Transistor" *Solid State Electronics*, vol. 22, No. 1, Jan. 1979, pp. 77–89 Van Calster.
"A Super Thin Transistor in Advanced Poly Si Films", *Japanese Journal of Applied Physics*, vol. 25, No. 4, Par 2, Apr. 1986, pp. 1291–1293, T. Ohshima.
"New FET Design Could Speed the Arrival of 3–D Circuits", *Electronics*, vol. 58, No. 36, Sep. 9, 1985, C. L. Cohen.
"Dual-a-Si:H Thin Film Transistors", *IEEE Electron Device Letter*, vol. EDL-3, No. 12, Dec. 1982, Tuan, et al.

*Primary Examiner*—J. Carroll
*Attorney, Agent, or Firm*—Ronald P. Kananen

[57] ABSTRACT

A thin film MOS transistor has a construction which can minimize scattering of electron and thus maximize electrons mobility for allowing higher speed operation of the transistor. For this, the MOS transistor has a thin film semiconductor layer having a thickness in a range less than or equal to 100 nm, between a pair of gate electrodes which oppose each other across the semiconductor layer.

20 Claims, 3 Drawing Sheets

THIN FILM MOS TRANSISTOR HAVING PAIR OF GATE ELECTRODES OPPOSING ACROSS SEMICONDUCTOR LAYER

This application is a continuation of application Ser. No. 07/232,133 filed Aug. 15, 1988, now abandoned.

BACKGROUND OF THE INVENTION

1. Field of the Invention

The present invention relates generally to a MOS transistor. More specifically, the invention relates to a MOS transistor which has a pair of electrodes opposing each other across a semiconductor layer. Further particularly, the invention relates to a thin film MOS transistor which has enhanced electron mobility.

2. Description of the Background Art

Conventionally, such types of thin film MOS transistors are provided with pairs of gate electrodes opposing each other across a semiconductor layer. In general, the semiconductor layers formed between the gate electrodes constitute thin film in a range of 3,000 nm to 5,000 nm. An energy level diagram of typical thin film MOS transistor is shown in FIG. 1. As will be seen from the energy level Ec at the end of energy transfer path as illustrated in FIG. 1, the lateral gradient of the transfer band over the energy transfer path tends to become substantial. This is caused by local concentration of the electron path on the surface of a channel. This causes narrowing of the electron path on the channel surface and thus causes scattering of free electrons, lowering electron mobility mobility $\mu$.

As will be appreciated, the electron mobility $\mu$ is one of the principle factors for determining the performance of this type of transistor, especially for operational speed of the transistor. On the other hand, the requirement for higher operational speed transistors becomes higher for widening the application of such semiconductor transistors. In this view, the thin film MOS transistors are required higher electron mobility.

SUMMARY OF THE INVENTION

Therefore, it is a principle object of the present invention to provide a thin film MOS transistor with satisfactorily high electron mobility.

Another object of the invention is to provide a thin film MOS transistor which has an improved geometry, making it easy to align components.

In order to accomplish the aforementioned and other objects, a thin film MOS transistor, according to the present invention, has a construction which can minimize scattering of electron and thus maximize electrons mobility for allowing higher speed operation of the transistor. For this, the MOS transistor has a thin film form semiconductor layer having a thickness in a range less than or equal to 100 nm, between a pair of gate electrodes which oppose each other across the semiconductor layer.

According to one aspect of the invention, a thin film MOS transistor comprises a first gate electrode formed on a substrate, a semiconductor active layer formed over the first gate electrode and opposing to the latter via a first insulating layer and defining source, drain and a channel regions, the channel region being between the source and drain regions, and which active layer has a thickness in a range less than or equal to 100 nm, and a second gate electrode formed over the active layer and opposing the latter via a second insulating layer.

The second insulating layer is preferably thinner than the first insulating layer. The first and second gate electrodes and the channel region of the active layer are arranged substantially in alignment.

In a practical construction, the active layer is formed of polycrystalline silicon.

The first and second gate electrodes are practically arranged at opposite sides of the active layer. The first gate electrode may be so arranged as to establish substantially smaller input capacity than that established by the second electrode. The first gate electrode may have a first gate length shorter than a second gate length of the second gate electrode.

According to another aspect of the invention, a thin film MOS transistor comprises a first gate electrode formed on a substrate and having a first gate length, a second gate electrode opposing the first gate electrode, the second gate electrode having a second gate length longer than the first length of the first gate electrode, the second gate electrode being arranged substantially in alignment with the first electrode, and a semiconductor active layer formed between the first and second gate electrodes and defining source, drain and a channel regions, the channel region being defined between the source and drain regions and opposing to the first gate electrode via a first insulating layer and to the second gate electrode via a second insulating layer, and the active layer having a thickness in a range less than or equal to 100 nm.

According to a still further aspect of the invention, a thin film MOS transistor comprises a first gate electrode formed on a substrate and having a first gate length, a second gate electrode opposing the first gate electrode, the second gate electrode having a second gate length longer than the first length of the first gate electrode, the second gate electrode being arranged substantially in alignment with the first electrode, and a semiconductor active layer formed between the first and second gate electrodes and defining source, drain and channel regions, the channel region being defined between the source and drain regions and opposing the first gate electrode via a first insulating layer and opposing the second gate electrode via a second insulating layer.

BRIEF DESCRIPTION OF THE DRAWINGS

The present invention will be understood more fully from the detailed description given herebelow and from the accompanying drawings of a preferred embodiment of the invention, which, however, should not be taken to limit the invention to the specific embodiment but are for explanation and understanding only.

In the drawings.

DESCRIPTION OF THE PREFERRED EMBODIMENT

Figure 1:
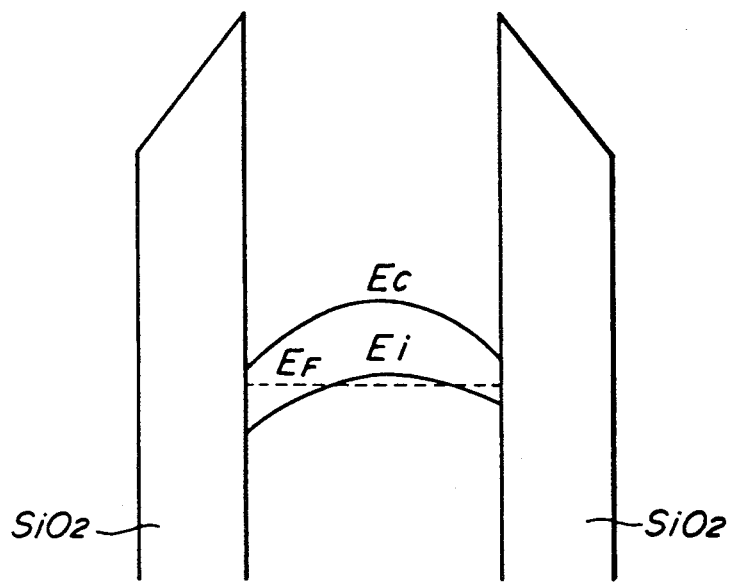
FIG. 1 is an energy level diagram of the conventional MOS transistor.
Figure 2:
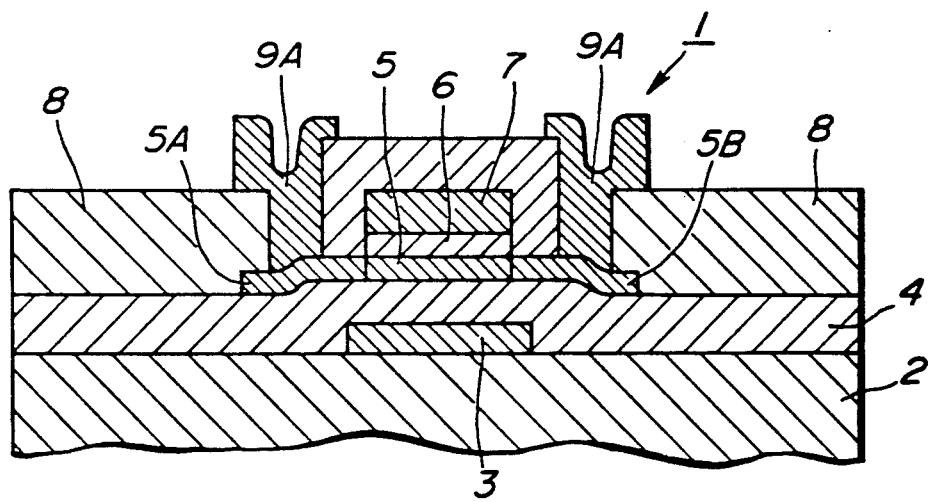
FIG. 2 is a sectional view of the first embodiment of a thin film MOS transistor according to the present invention.

Referring now to the drawings, particularly to FIG. 2, the first embodiment of a thin film MOS transistor, according to the present invention, is generally referred to by the reference numeral "1". The MOS transistor 1 has a substrate 2 which is made of quartz. A gate electrode 3 of polycrystalline silicon is formed on the quartz substrate 2. The polycrystalline silicon gate electrode 3 will be hereinafter referred to as "first gate electrode". An insulation layer 4 of silicon dioxide ($SiO_2$) is formed over the quartz substrate surface and over the polycrystalline silicon gate electrode 3.

An active 5 of semiconductor layer is formed on the surface of the silicon dioxide insulation layer 4. In the embodiment shown, the semiconductor active layer 5 is formed of polycrystalline silicon, by way of chemical vapor deposition and other appropriate process. The thickness of the semiconductor active layer 5 is in a range of less than or equal to 100 nm.

Though the illustrated embodiment of the thin film MOS transistor employs polycrystalline silicon to form the semiconductor active layer, any other appropriate material can be used for forming the semiconductor active layer. For example, monocrystalline silicon can be used in place of the polycrystalline silicon for forming the semiconductor active layer.

In the embodiment shown, the semiconductor active layer 5 is formed as a P-type layer. An $N^+$ type impurity is doped at both lateral end portions of the semiconductor active layer for forming a source region 5A and a drain region 5B.

A gate insulation layer 6 and a gate electrode 7 are formed on the semiconductor active layer 5. The gate electrode 7 will be hereinafter referred to the as the "second gate electrode". The gate insulation layer 6 is formed of silicon dioxide. On the other hand, the second gate electrode 7 is formed of polycrystalline silicon. These silicon dioxide gate insulation layer 6 and the second polycrystalline silicon gate electrode 7 are arranged on the semiconductor active layer 5 in alignment with the first polycrystalline silicon gate electrode 3. As will be seen from FIG. 2, the thickness of the silicon dioxide gate insulation layer 6 is thinner than that of the insulation layer 4. Therefore, the distance between the second polycrystalline silicon gate electrode 7 and the opposing surface of the semiconductor active layer 5 is smaller than that between the first polycrystalline silicon gate electrode 3 and the opposing surface of the semiconductor active layer 5. As a result, the effectiveness of the second polycrystalline silicon gate electrode 7 becomes greater than that of the first polycrystalline silicon gate electrode 7.

As far as the electron mobility is concerned, equal distances between the two gate electrodes and the active layer may exhibit equivalent performance to that of the embodiment show. However, illustrated the arrangement of the gate electrodes relative to the active layer is preferred for maintaining the input capacitance level equivalent to a single gate type MOS transistor. This can be achieved by setting the input capacity created by the first gate electrode small, by providing greater distance to the active layer.

Additionally, the MOS transistor 1 has an insulation layer 8 and aluminum electrodes 9A and 9B for external connection. The aluminum electrodes 9A and 9B are respectively connected to the source region 5A and the drain region 5B of the semiconductor active layer.

Figure 3:
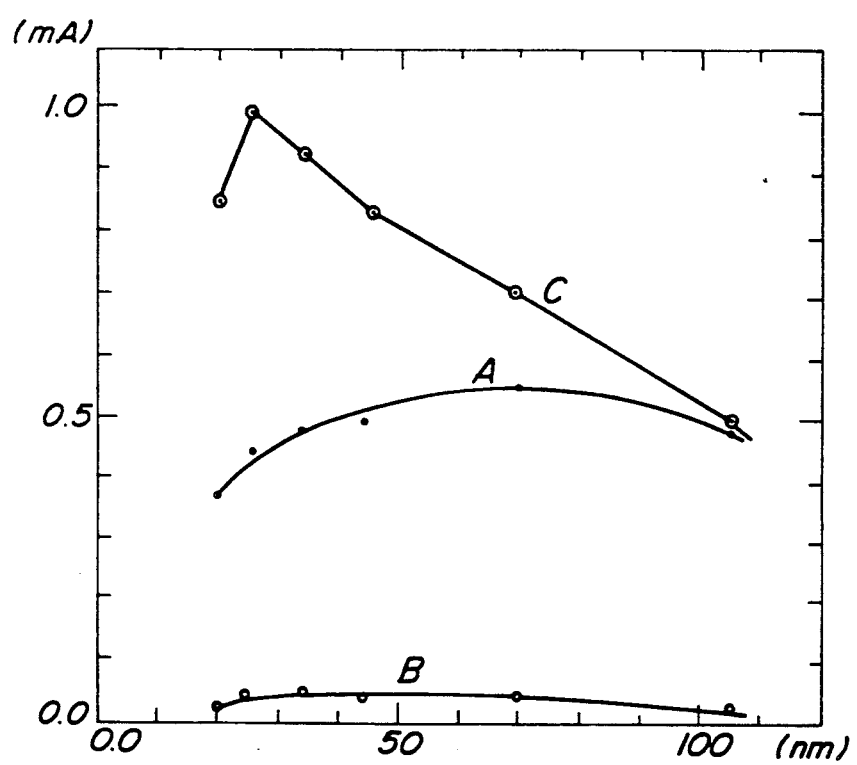
FIG. 3 is a graph showing the relationship between thickness of the active layer and the drain current in a MOS transistor.

FIG. 3 shows variation of drain current in relation to the thickness of the semiconductor active layer. In FIG. 3, line A shows variation of drain current when the second polycrystalline silicon gate electrode 7 is solely used; line B shows variation of drain current when the first polycrystalline silicon gate electrode 3 is solely used; and line C shows variation of drain current when both gate electrodes are used. With respect to the line C, it will be appreciated that when both of the first and second polycrystalline silicon gate electrodes 3 and 7 are used, the drain current become greater than the sum value of drain currents obtained when each one of the second and first polycrystalline silicon gate electrodes is solely used, in a range of thickness of the semiconductor active layer 5 less than or equal to 100 nm. This means when both gate electrodes are used in combination, greater current then the sum value of the currents flowing through channels respectively formed on the active region solely by one of the second and first polycrystalline silicon gate electrodes 7 and 3. This results from the mutual influence of electric fields formed around both second and first polycrystalline silicon gate electrodes which increase electron mobility $\mu$ in the channel.

Figure 4:
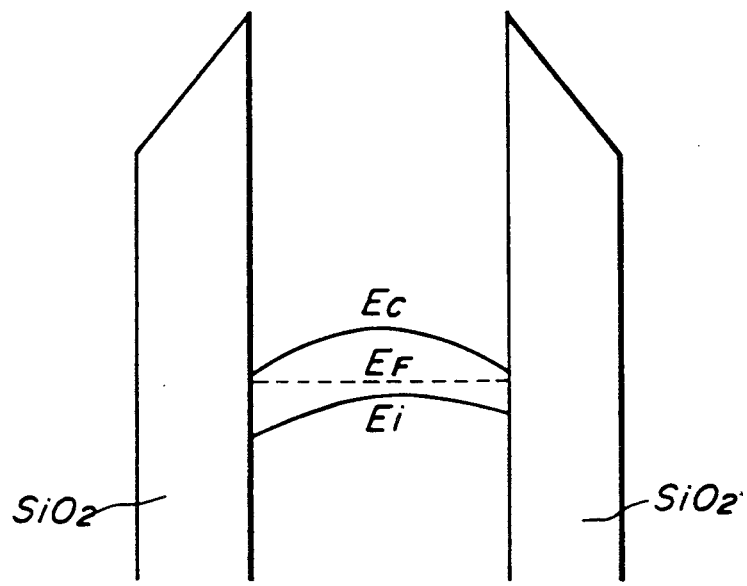
FIG. 4 is an energy level diagram of the first embodiment of the MOS transistor of FIG. 2.

FIG. 4 is energy level diagram of the above embodiment of the MOS transistor, showing the lateral energy level Ec distribution. As seen, the line Ec representing the energy level approaches the Fermi-level $E_F$ shown by the broken line the line Ec thus being close to flat. By this, the electron mobility $\mu$ and mutual conductance gm are increased. In FIG. 4, the line Ei represents center of forbidden band.

As will be appreciated herefrom, the illustrated embodiment of the thin film transistor according to the invention is successful to provide a satisfactorily high electron mobility, and thus to make the MOS transistor applicable for LSI.

Figure 5:
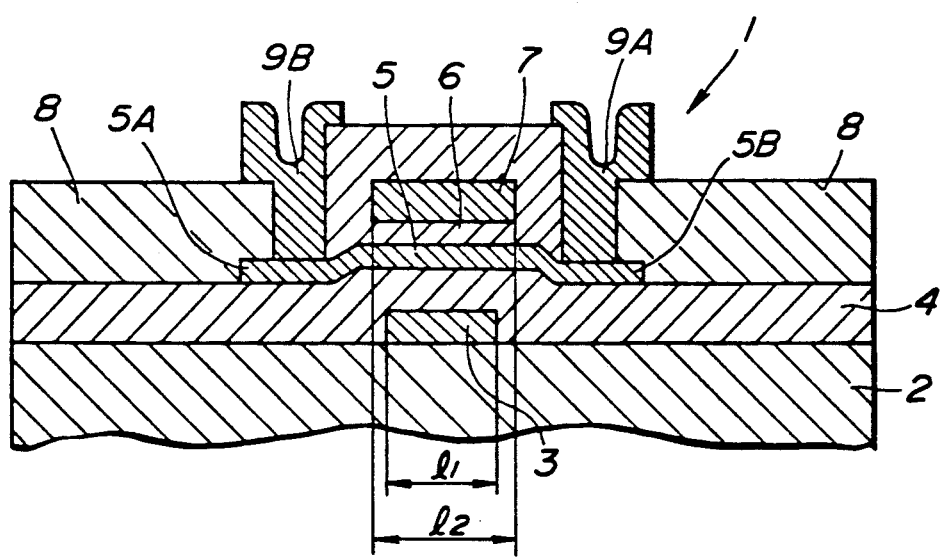
FIG. 5 is a sectional view of the second embodiment of the thin film MOS transistor according to the present invention.

FIG. 5 shows the second embodiment of the thin film MOS transistor, according to the invention. The constructional components of MOS transistor of this illustrated embodiment are represented by the same reference numerals as that of the former embodiment, and no further detailed discussion.

This second embodiment show features a novel geometry which allows easy alignment of the first and second polycrystalline silicon gate electrodes 3 and 7. In the shown embodiment, the first polycrystalline silicon gate electrode 3 has a gate length $l_1$. On the other hand, the second polycrystalline silicon gate electrode 7 has a gate length $l_2$ which is longer than the gate length $l_1$ of the first polycrystalline silicon gate electrode 3.

In production, the semiconductor active layer 5 is formed in self-alignment with the second polycrystalline silicon gate electrode 7. Therefore, even when the first and second polycrystalline silicon gate electrodes 3 and 7 mutually offset to be off-center with respect to each other, the first polycrystalline silicon gate electrode 3 can be maintained beneath the second polycrystalline silicon gate electrode 7 and beneath the region (channel region) between the source and drain regions 5A and 5B of the semiconductor active layer 5.

Therefore, the first polycrystalline silicon gate electrode 3 will never be placed in a position partially or in whole opposing one of the source and drain regions 5A and 5B. This minimizes the parasitic capacitance created between the first polycrystalline silicon gate electrode and either of the source and drain regions. Therefore, the element characteristics of the MOS transistor can be maintained acceptable.

Furthermore, since the geometry shown for the second embodiment does not require substantial precision in fabrication, production of such MOS transistor becomes easier to achieve with substantially high yield.

Therefore, the invention fulfills all of the objects and advantages sought therefor.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A thin film MOS transistor comprising:
   a first gate electrode formed on an insulating substrate;
   a first insulating layer formed over said substrate and said first gate electrode;
   a semiconductor active layer formed over said first insulating layer to extend across said first gate electrode and beyond said first gate electrode on both sides of said first gate electrode, said active layer including source and drain regions on respective opposite sides of said first gate electrode and a channel region extending between said source and drain regions, said active layer having a thickness less than or equal to 100 nm;
   a second insulating layer thinner than said first insulating layer and formed over said active layer and a second gate electrode formed over said second insulating layer, and second gate electrode being in electrical communication with said first said gate electrode and extending over said channel region of said active layer; and
   source and drain electrodes connecting respectively to said source and drain regions through said second insulating layer and being at spaced distances from said first and second gate electrodes and said channel region;
   wherein the Fermi level in said channel region is higher than the center of the forbidden band, including at the center of said channel region halfway between said first and second insulating layers, and the Fermi level in said channel region is at about the bottom of the conduction band of the channel region at the top and bottom of said channel region, namely at the boundaries of said channel region with the first and second insulating layers.

2. A thin film MOS transistor as set forth in claim 1, wherein said first and second gate electrodes and said channel region of said active layer are arranged substantially in overlapping alignment, without overlap of said second gate electrode with any part of said source and drain regions of said active layer.

3. A thin film MOS transistor as set forth in claim 1, wherein said active layer is formed of polycrystalline silicon.

4. A thin film MOS transistor as set forth in claim 1, wherein said first gate electrode has substantially smaller input capacitance than said second gate electrode.

5. A thin film MOS transistor as set forth in claim 1, wherein said first gate electrode has a first gate length shorter than a second gate length of said second gate electrode, and wherein no part of said first gate electrode lies under any part of said source and drain regions of said active layer.

6. The MOS transistor of claim 1, wherein said second insulating layer is of the same material as said first insulating layer.

7. A thin film MOS transistor comprising:
   a first gate electrode formed on an insulating substrate and having a first gate length;
   a second gate electrode opposing said first gate electrode, said second gate electrode having a second gate length longer than said first gate length of said first gate electrode, said second gate electrode being arranged substantially in alignment with said first electrode; and
   a semiconductor active layer and first and second insulating layer formed between said first and second gate electrodes, said first insulating layer being thicker than said second insulating layer, said active layer having source and drain regions and a channel region between said source and drain regions, said active layer opposing said first gate electrode via said first insulating layer and opposing said second gate electrode via said second insulating layer, and said active layer having a thickness in a range less than or equal to 100 nm;
   source and drain electrodes connecting respectively to said source and drain regions through said second insulating layer and being at spaced distances from said first and second gate electrodes and said channel region;
   wherein the Fermi level in said channel region is higher than the center of the forbidden band, including at the center of said channel region halfway between said first and second insulating layers, and the Fermi level in said channel region is at about the bottom of the conduction band of the channel region at the top and bottom of said channel region, namely at the boundaries of said channel region with the first and second insulating layers.

8. A thin film MOS transistor as set forth in claim 7, wherein said first and second gate electrodes and said channel region of said active layer are arranged substantially in overlapping alignment, without overlap of said second gate electrode with any part of said source and drain regions of said active layer.

9. A thin film MOS transistor as set forth in claim 7, wherein said active layer is formed of polycrystalline silicon.

10. A thin film MOS transistor as set forth in claim 7, wherein said first and second gate electrodes are arranged at opposite sides of said active layer.

11. A thin film MOS transistor as set forth in claim 7, wherein said first gate electrode is provided so as to have substantially smaller input capacitance than that of said second gate electrode.

12. A thin film MOS transistor comprising:
   a first gate electrode formed on a substrate and having a first gate length;
   a second gate electrode opposing said first gate electrode, said second gate electrode having a second gate length longer than said first length of said first gate electrode, said second gate electrode being arranged substantially in alignment with said first electrode;

a semiconductor active layer and first and second insulating layers formed between said first and second gate electrodes, said first insulating layer being thicker than said second insulating layer, said active layer having source and drain regions and a channel region between said source and drain regions, said channel region opposing said first gate electrode via said first insulating layer and opposing said second gate electrode via said second insulating layer;

source and drain electrodes connecting respectively to said source and drain regions through said second insulating layer and being at spaced distances from said first and second gate electrodes and said channel region;

wherein the Fermi level in said channel region is higher than the center of the forbidden band, including at the center of said channel region halfway between said first and second insulating layers, and the Fermi level in said channel region is at about the bottom of the conduction band of the channel region at the top and bottom of said channel region, namely at the boundaries of said channel region with the first and second insulating layers.

13. A thin film MOS transistor as set forth in claim 12, wherein said first and second gate electrodes and said channel region of said active layer are arranged substantially in overlapping alignment, without overlap of said second gate electrode with any part of said source and drain regions of said active layer.

14. A thin film MOS transistor as set forth in claim 13, wherein said active layer is formed of polycrystalline silicon.

15. A thin film MOS transistor comprising:

a first gate electrode formed on a substrate and having a first gate length;

a second gate electrode opposing said first gate electrode, said second gate electrode having a second gate length longer than said first length of said first gate electrode, said second gate electrode being arranged substantially in alignment with said first electrode;

a semiconductor active layer and first and second insulating layers formed between said first and second gate electrodes, said first insulating layer being thicker than said second insulating layer, said active layer having source and drain regions and a channel region between said source and drain regions, said channel region opposing said first gate electrode via said first insulating layer and opposing said second gate electrode via said second insulating layer; and wherein said first gate electrode has a substantially smaller input capacitance than that established by said second gate electrode, and said first and second gate electrodes do not overlap via the respective ones of said first and second insulating layers any part of said source or drain regions of said active layer;

source and drain electrodes connecting respectively to said source and drain regions through said second insulating layer and being at spaced distances from said first and second gate electrodes and said channel region;

wherein the Fermi level in said channel region is higher than the center of the forbidden band, including at the center of said channel region halfway between said first and second insulating layers, and the Fermi level in said channel region is at about the bottom of the conduction band of the channel region at the top and bottom of said channel region, namely at the boundaries of said channel region with the first and second insulating layers.

16. A thin film MOS transistor as set forth in claim 15, wherein the thickness of said active layer is less than or equal to 100 nm.

17. A thin film MOS transistors comprising:

a first gate electrode formed on an insulating substrate;

a first insulating layer formed over said substrate and said first gate electrode;

a semiconductor active layer formed over said first insulating layer to extend across said first gate electrode and beyond said first gate electrode on both sides of said first gate electrode, said active layer including source and drain regions on respective opposite sides of said first gate electrode and a channel region extending between said source and drain regions, said active layer having a thickness less than or equal to 100 nm;

a second insulating layer thinner than said first insulating layer and formed over said active layer and a second gate electrode formed over said second insulating layer, said second gate electrode being connected with said first gate electrode and extending over said channel region of said active layer; and source and drain electrodes connecting respectively to said source and drain regions through said second insulating layer and being at spaced distances from said first and second gate electrodes and said channel region;

wherein the Fermi level in said channel region is higher than the center of the forbidden band, including at the center of said channel region halfway between said first and second insulating layers, and the Fermi level in said channel region is at about the bottom of the conduction band of the channel region at the top and bottom of said channel region, namely at the boundaries of said channel region with the first and second insulating layers, and wherein the drain current of said MOS transistor when both said first and second gate electrodes are used to turn the MOS transistor ON is substantially greater than the sum of the respective drain currents when each of said first and second gate electrodes is used alone to turn the MOS transistor ON.

18. The MOS transistor of claim 17, wherein the difference between 1) said drain current when both said first and second gate electrodes are used to turn the MOS transistor ON, and 2) said drain currrent when said second gate electrode is used alone to turn the MOS transistor ON, is substantially more than twice said drain current when said first gate electrode is used along to turn the MOS transistor ON.

19. The MOS transistor of claim 17, wherein said drain current when both said first and second gate electrodes are used to turn the MOS transistor ON varies up to 1 mA as said thickness of said active layer is reduced in a range below 50 nm.

20. The MOS transistor of claim 17, wherein said thin active layer is at least approximately 20 nm thick.

* * * * *